(12) United States Patent
Durcan et al.

(10) Patent No.: US 6,780,732 B2
(45) Date of Patent: Aug. 24, 2004

(54) DRAM ACCESS TRANSISTOR

(75) Inventors: D. Mark Durcan, Boise, ID (US); Roger Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/270,150

(22) Filed: Oct. 15, 2002

(65) Prior Publication Data

US 2003/0040154 A1 Feb. 27, 2003

Related U.S. Application Data

(63) Continuation of application No. 09/842,788, filed on Apr. 27, 2001, now Pat. No. 6,498,062.

(51) Int. Cl.[7] ............................................. H01L 21/76
(52) U.S. Cl. ...................................... 438/430; 257/520
(58) Field of Search ................................ 438/221, 359, 438/361, 424, 430, 238–239, 243, 248, 128, 270–272, 586, 589, 259, 391; 257/311, 506, 508, 510, 513, 520, 296, 300, 302, 329–334, 401

(56) References Cited

U.S. PATENT DOCUMENTS

| | | |
|---|---|---|
| 4,651,184 A | 3/1987 | Malhi |
| 4,785,337 A | 11/1988 | Kenney |
| 4,989,055 A | 1/1991 | Redwine |
| 5,346,834 A | 9/1994 | Hisamoto |
| 5,349,218 A | 9/1994 | Tadaki et al. |
| 5,429,970 A | 7/1995 | Hong |
| 5,489,791 A | 2/1996 | Arima et al. |
| 5,576,227 A | 11/1996 | Hsu |
| 5,798,544 A * | 8/1998 | Ohya et al. .................. 257/296 |
| 5,801,417 A | 9/1998 | Tsang |
| 5,963,838 A | 10/1999 | Yamamoto et al. |
| 6,087,235 A | 7/2000 | Yu |
| 6,236,079 B1 | 5/2001 | Nitayama et al. |
| 6,515,338 B1 * | 2/2003 | Inumiya et al. .............. 257/368 |

FOREIGN PATENT DOCUMENTS

| | | |
|---|---|---|
| DE | 199 28 781 C1 | 7/2000 |
| EP | 0 744 722 A1 | 11/1966 |
| EP | 0 936 673 A1 | 8/1999 |
| EP | 1 003 219 A2 | 5/2000 |

* cited by examiner

Primary Examiner—David Nelms
Assistant Examiner—David Vu
(74) Attorney, Agent, or Firm—Dickstein Shapiro Morin & Oshinsky LLP

(57) ABSTRACT

A method of forming memory devices, such as DRAM access transistors, having recessed gate structures is disclosed. Field oxide areas for isolation are first formed over a semiconductor substrate subsequent to which transistor grooves are patterned and etched in a silicon nitride layer. The field oxide areas adjacent to the transistor grooves are then recessed, so that subsequently deposited polysilicon for gate structure formation can be polished relative to the adjacent and elevated silicon nitride.

16 Claims, 10 Drawing Sheets

DRAM ACCESS TRANSISTOR

This application is a continuation of application Ser. No. 09/842,788, filed on Apr. 27, 2001, now U.S. Pat. No. 6,498,062, the entirety of which is incorporated by reference herein.

FIELD OF THE INVENTION

The present invention relates to dynamic random access memory (DRAM) cells and, in particular, to a novel process for their formation.

BACKGROUND OF THE INVENTION

A dynamic random access memory cell typically comprises a charge storage capacitor (or cell capacitor) coupled to an access device, such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the electrode (or storage node) area and the interelectrode spacing. The conditions of DRAM operation such as operating voltage, leakage rate and refresh rate, will generally mandate that a certain minimum charge be stored by the capacitor.

In the continuing trend to higher memory capacity, the packing of storage cells must increase, yet each will maintain required capacitance levels. This is a crucial demand of DRAM fabrication technologies if future generations of expanded memory array devices are to be successfully manufactured. Recently, attempts to increase the packing density of cell capacitors and/or to simultaneously reduce the transistor size have been made but with limited results. For example, one approach is reducing the length of a transistor gate electrode formed atop a substrate and a source/drain region, to increase therefore the integration density. Unfortunately, reduction of the threshold voltage and/or the so-called short channel effect such as the punch-through phenomenon are likely to appear. A well-known scaling method is effective to improve the above-mentioned disadvantages. However, this approach increases of the substrate density and requires reduction of the supply voltage, which in turn leads to reduction of the margin concerning the electric noise and fluctuations in the threshold voltage.

Accordingly, there is a need for an improved method of forming MOS semiconductor devices, which permits achieving an increased integration of semiconductor circuitry as well as preventing the occurrence of the short-channel effect.

SUMMARY OF THE INVENTION

The present invention provides a method of forming memory devices, such as DRAM access transistors, having recessed gate structures. Field oxide areas for isolation are first formed over a semiconductor substrate subsequent to which transistor grooves are patterned and etched in a silicon nitride layer. The field oxide areas adjacent to the transistor grooves are then recessed, so that subsequently deposited polysilicon for gate structure formation can be polished relative to adjacent and elevated silicon nitride structures.

These and other advantages and features of the present invention will be more apparent from the detailed description and the accompanying drawings, which illustrate exemplary embodiments of the invention.

DETAILED DESCRIPTION OF THE INVENTION

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has an exposed semiconductor surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Figure 1:
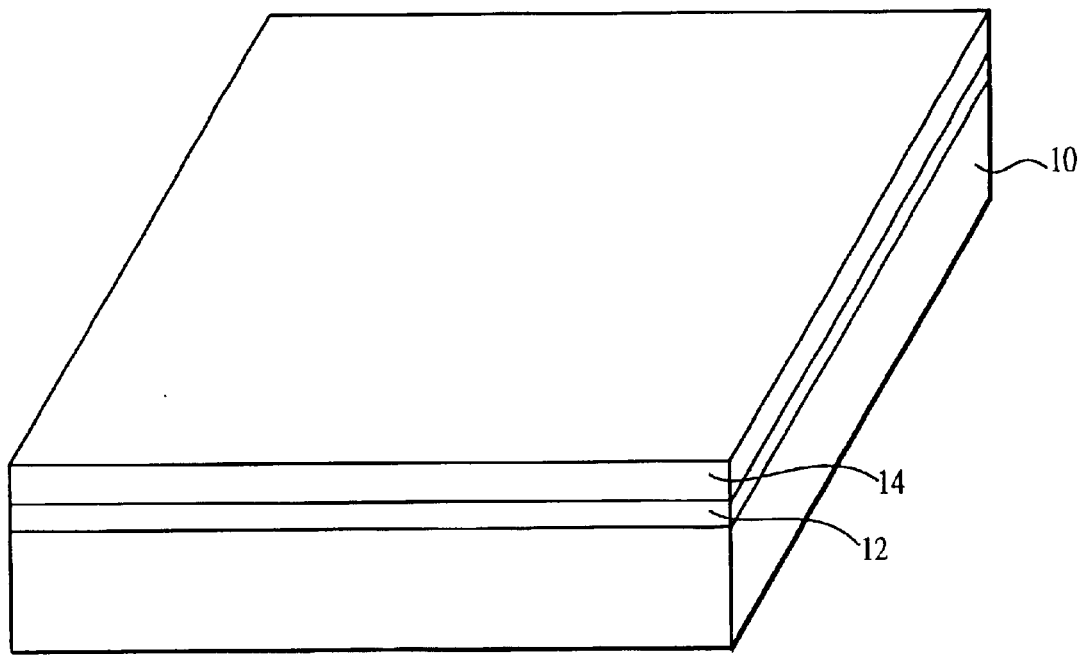
FIG. 1 illustrates a three dimensional view of a portion of a semiconductor device on which a DRAM access transistor will be formed according to a method of the present invention.
Figure 2:
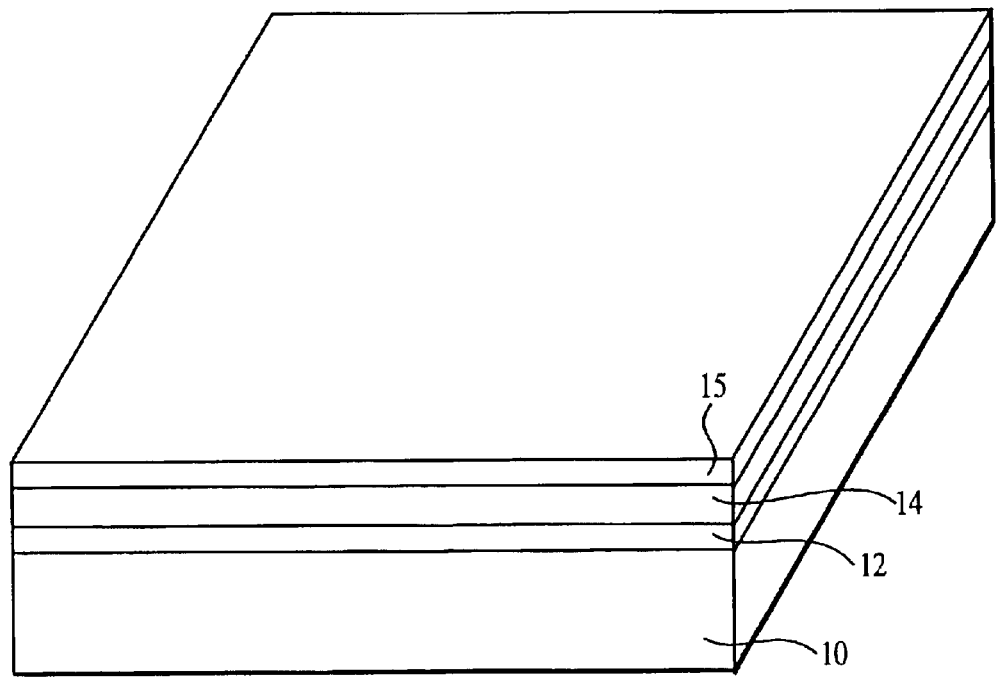
FIG. 2 illustrates a three dimensional view of the FIG. 1 device at a stage of processing subsequent to that shown in FIG. 1.

Referring now to the drawings, where like elements are designated by like reference numerals, FIGS. 1–22 illustrate a method of forming a DRAM memory device 100 (FIG. 22) having access transistors formed according to exemplary embodiments of the present invention. FIG. 1 illustrates a semiconductor substrate 10 over which a thin thermally grown oxide layer 12, with a thickness of about 50 Angstroms to about 200 Angstroms, has been formed according to conventional semiconductor processing techniques. An insulating layer 14 such as silicon nitride ($Si_3N_4$) layer 14 (FIG. 1) of about 100 Angstroms to about 1,000 Angstroms is next disposed over the substrate 10 and the oxide layer 12. The silicon nitride layer 14 may be formed by known deposition processes such as sputtering by chemical vapor deposition (CVD) or low temperature deposition by electron cyclotron resonance plasma enhanced CVD, among others. Although reference to the insulating layer 14 will be made as to the silicon nitride layer 14, it must be understood that the insulating layer 14 may be also formed of silicon oxide, for example, or other insulating materials, and thus the invention is not limited to the use of silicon nitride.

Figure 3:
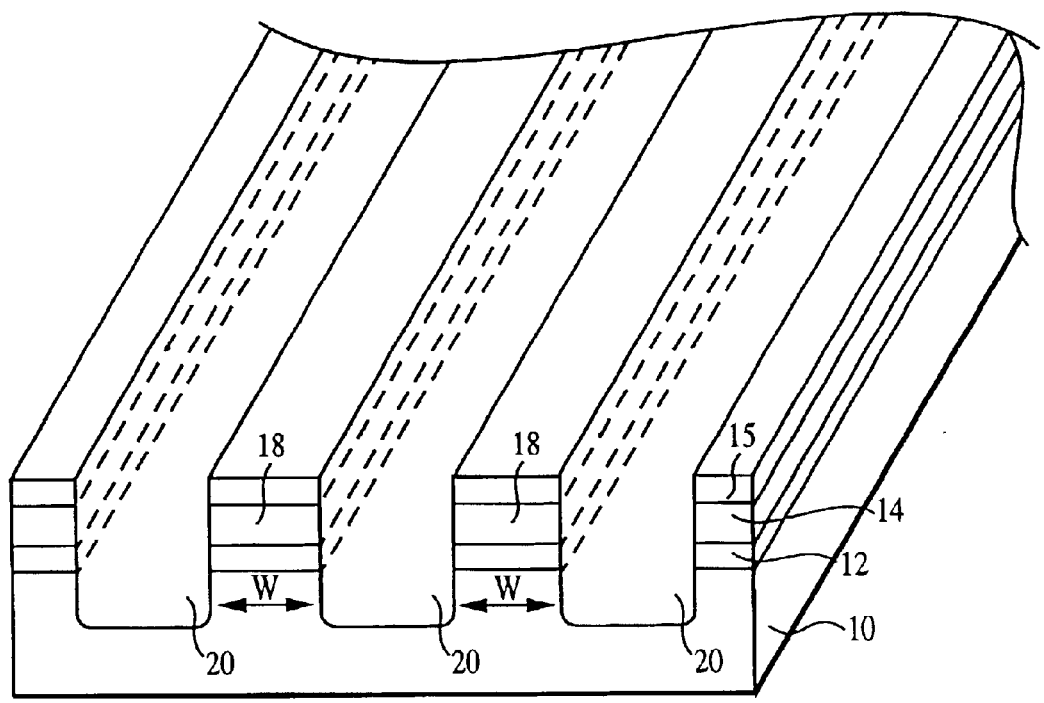
FIG. 3 illustrates a three dimensional view of the FIG. 1 device at a stage of processing subsequent to that shown in FIG. 2.
Figure 4:
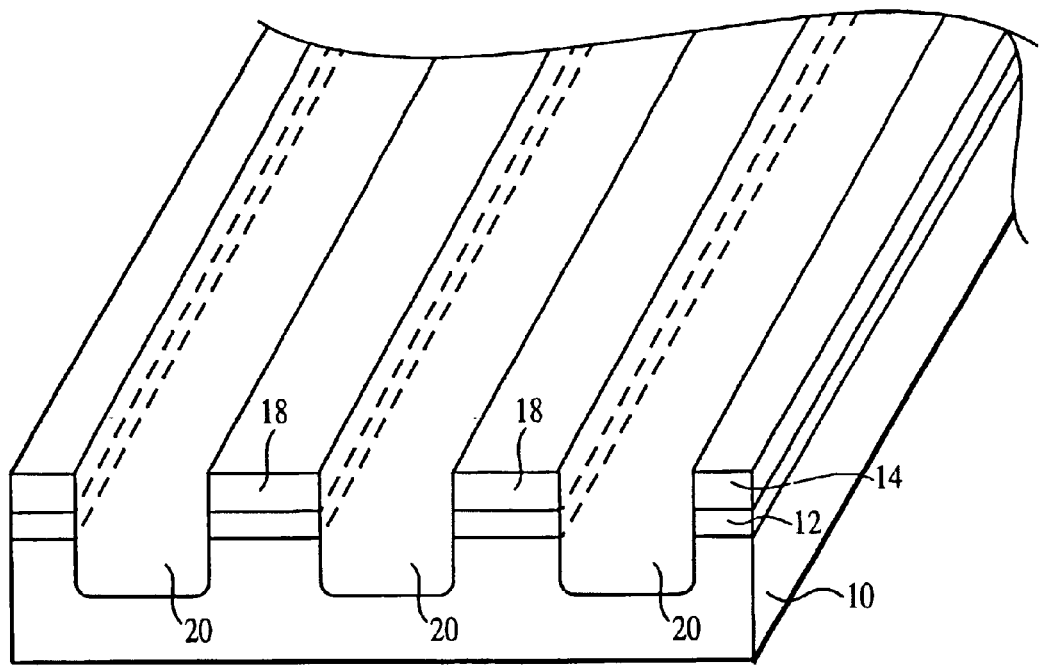
FIG. 4 illustrates a three dimensional view of the FIG. 1 device at a stage of processing subsequent to that shown in FIG. 3.

Next, the silicon nitride layer 14 is patterned using a photoresist layer 15 (FIG. 2) formed over the silicon nitride layer 14 to a thickness of about 1,000 Angstroms to about 10,000 Angstroms. The photoresist layer 15 is patterned with a mask (not shown) and the silicon nitride layer 14 is anisotropically etched through the patterned photoresist to obtain a plurality of silicon nitride columns 18 having a width W of about 1,000 Angstroms to about 2,000 Angstroms and shallow trenches for isolation (STI) 20, as shown in FIG. 3. To obtain the shallow trenches for isolation 20, the silicon nitride layer 14, the oxide layer 12 and the substrate 10 are all etched to a depth of about 1,000 Angstroms to about 10,000 Angstroms, preferably of about 5,000 Angstroms. Subsequent to the formation of the shallow trenches for isolation 20, the photoresist layer 15 is removed by conventional techniques, such as oxygen plasma, for example, or by flooding the substrate 10 with UV irradiation to degrade the photoresist and obtain the structure of FIG. 4.

Figure 5:
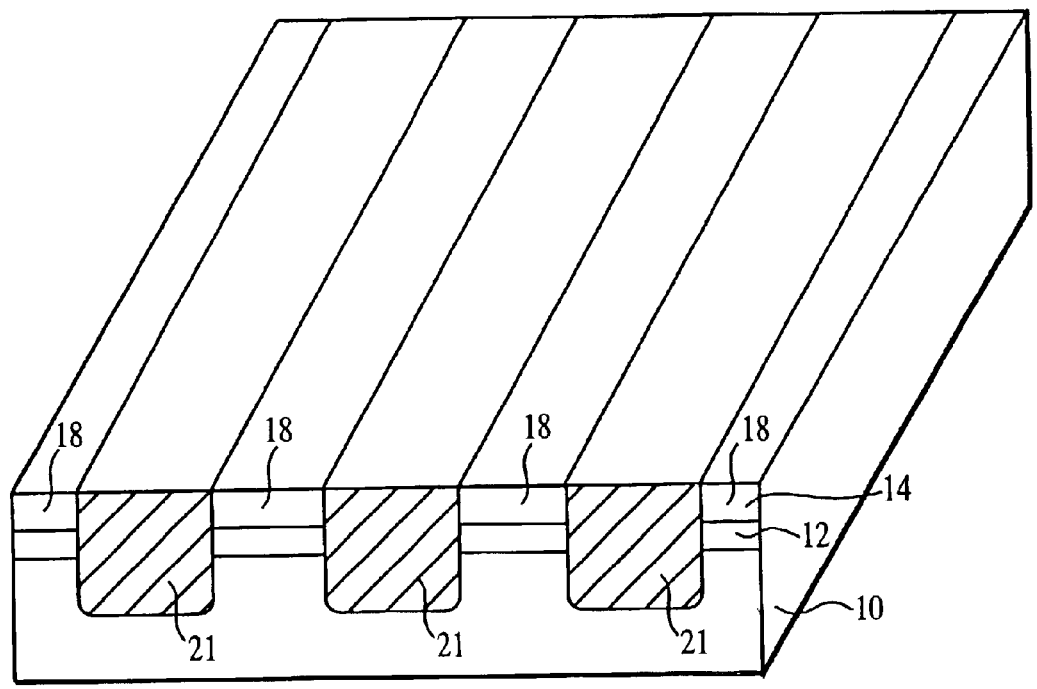
FIG. 5 illustrates a three dimensional view of the FIG. 1 device at a stage of processing subsequent to that shown in FIG. 4.

Subsequent to the formation of the shallow trenches for isolation 20 (FIGS. 3–4), the trenches are filled with an isolation dielectric 21, illustrated in FIG. 5. Any dielectric suitable for isolation may be employed to fill trenches 20. In an exemplary embodiment, trenches 20 are filled with high density plasma (HDP) oxide, a material which has a high ability to effectively fill narrow trenches. Alternatively, an insulating layer (not shown) formed of an oxide or of silicon nitride, for example, may be formed on the trench sidewalls, prior to filling the trenches 20 with the isolation dielectric 21, to aid in smoothing out the corners in the bottom of the trenches and to reduce the amount of stress in the dielectric used to later fill in the trenches.

Figure 6:
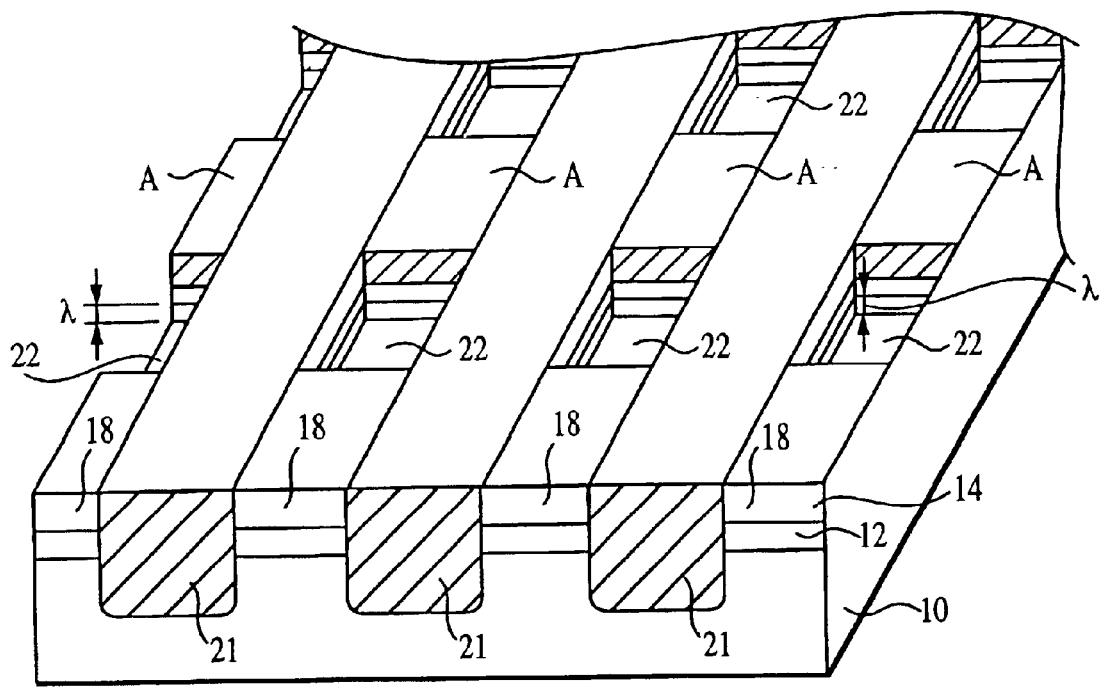
FIG. 6 illustrates a three dimensional view of the FIG. 1 device at a stage of processing subsequent to that shown in FIG. 5.

Reference is now made to FIG. 6. The silicon nitride columns 18 are patterned and etched to form regions A adjacent to the isolation dielectric 21 and transistor grooves 22. The silicon nitride layer 14, the oxide layer 12 and the substrate 10 are all etched, by reactive ion etching, for example, to a depth of about 1,000 Angstroms to about 10,000 Angstroms to obtain the transistor grooves 22 where gate structures of the DRAM memory device 100 (FIG. 22) will be later formed as it will be described in detail below. To form the transistor grooves 22, substrate 10 is etched to a depth λ (FIG. 6) of about 500 Angstroms to about 5,000 Angstroms.

Figure 7:
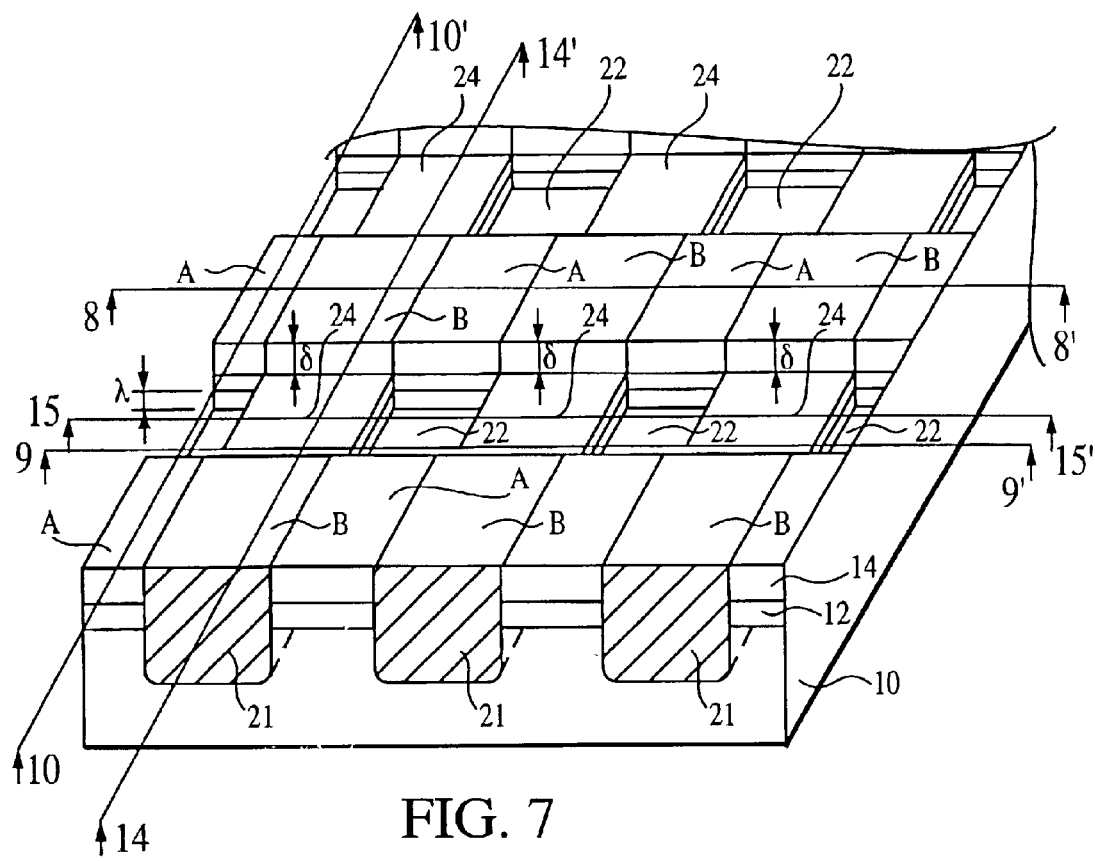
FIG. 7 illustrates a three dimensional view of the FIG. 1 device at a stage of processing subsequent to that shown in FIG. 6.
Figure 8:
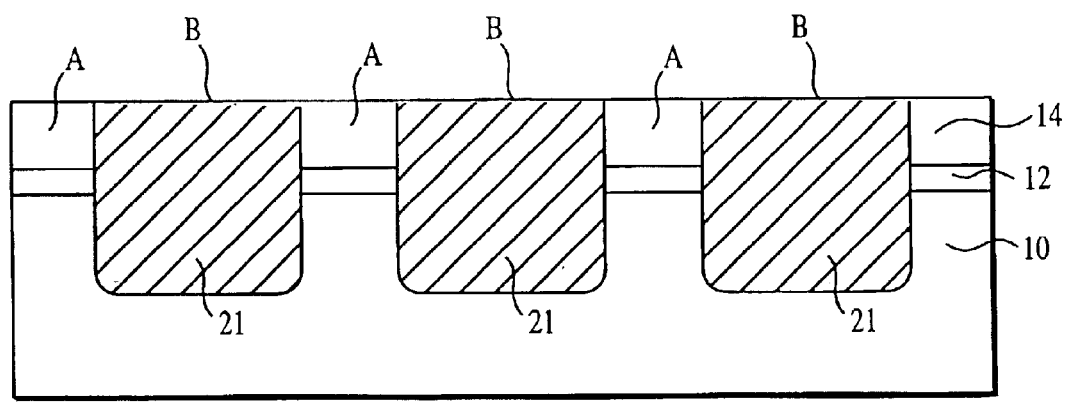
FIG. 8 illustrates a cross-sectional view of the FIG. 7 device taken along line 8–8'.
Figure 9:
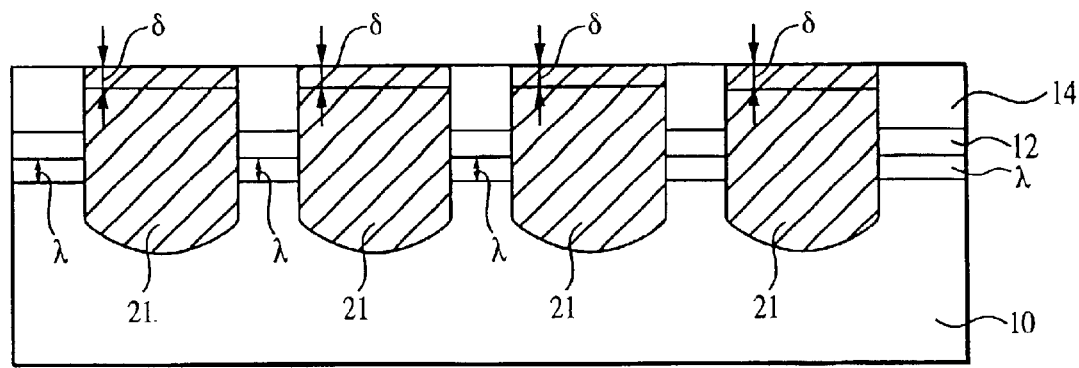
FIG. 9 illustrates a cross-sectional view of the FIG. 7 device taken along line 9–9'.

Subsequent to the formation of the transistor grooves 22 (FIG. 6) and regions A (FIG. 6), the isolation dielectric 21 is partially etched with a selective etchant to obtain recessed structures 24 adjacent to isolation regions B, as shown in FIG. 7. The isolation dielectric 21 is etched to a depth δ (FIG. 7) of about 500 Angstroms to about 3,000 Angstroms, by a directional etching process such as plasma etching, for example. As it will be explained below, the isolation dielectric 21 is recessed to allow a subsequently deposited polysilicon to be chemical mechanically polished relative to the remaining silicon nitride from the silicon nitride layer 14. Cross-sectional views of the recessed structures 24 (FIG. 7) and the isolation regions B (FIG. 7) in relation to the transistor grooves 22 are illustrated in FIGS. 8 and 9 for a better understanding of the invention.

Figure 10:
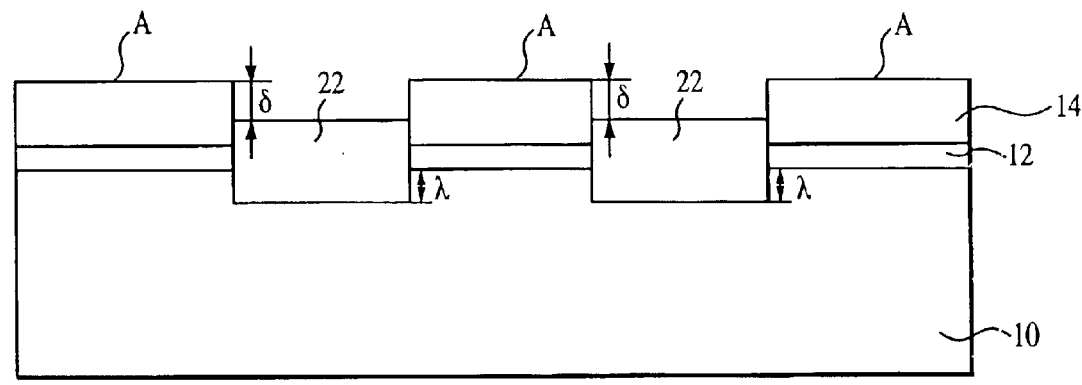
FIG. 10 illustrates a cross-sectional view of the FIG. 7 device taken along line 10–10'
Figure 11:
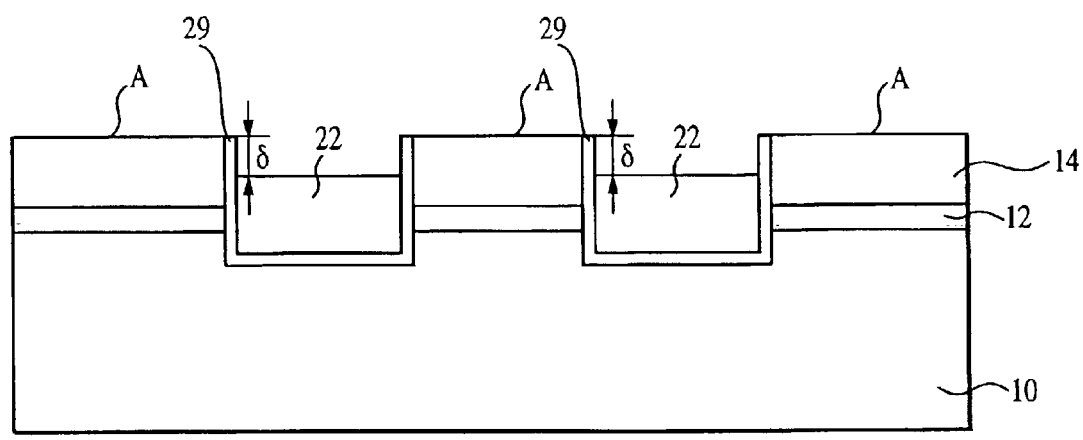
FIG. 11 illustrates a cross-sectional view of the FIG. 10 device at a stage of processing subsequent to that shown in FIG. 10.
Figure 12:
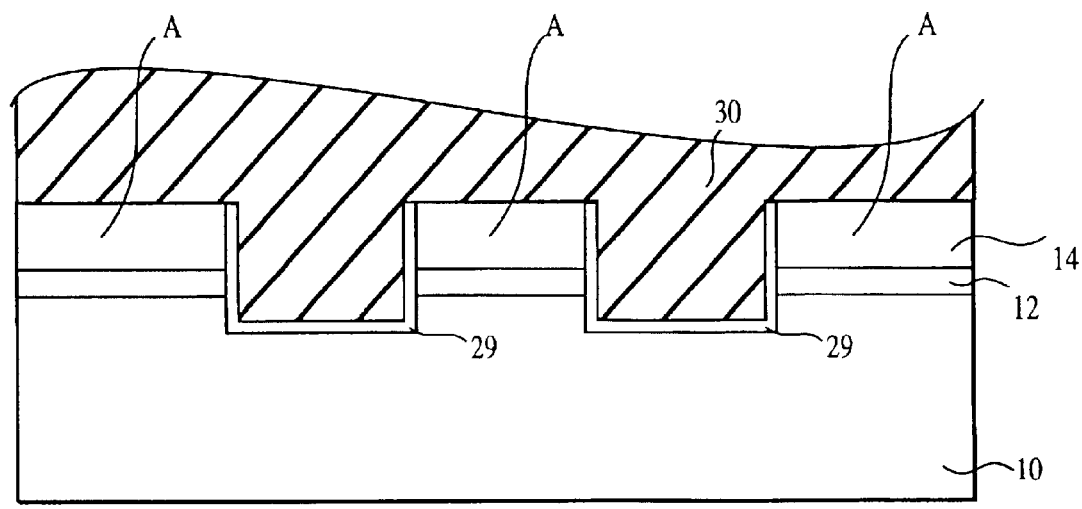
FIG. 12 illustrates a cross-sectional view of the FIG. 10 device at a stage of processing subsequent to that shown in FIG. 11.

Reference is now made to FIG. 10, which is a cross-sectional view of the structure of FIG. 7 taken along line 10–10' and illustrating the regions A and the transistor grooves 22. At this point, processing steps for transistor gate structure formation proceed according to conventional semiconductor processing techniques. As such, a thin gate oxide layer 29 is first formed on the sidewalls and bottoms of the transistor grooves 22, as shown in FIG. 11. The thin gate oxide layer 29 may be thermally grown in an oxygen ambient, at a temperature between about 600° C. to about 1,000° C. and to a thickness of about 30 Angstroms to about 100 Angstroms.

Figure 13:
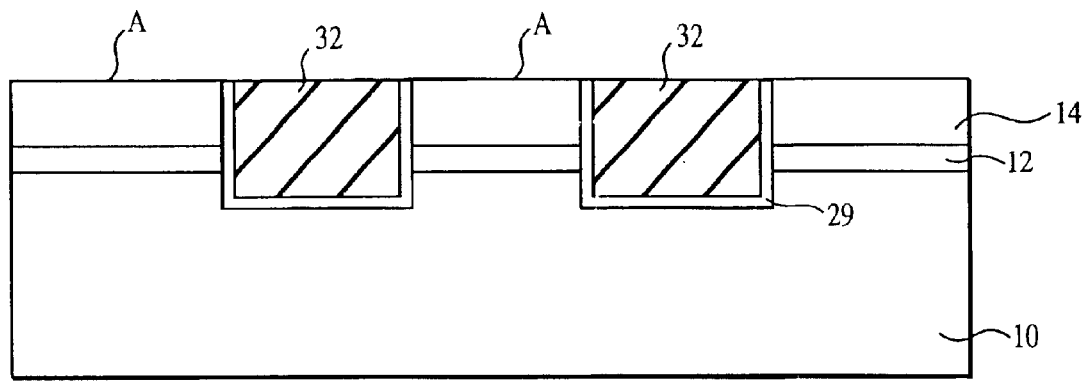
FIG. 13 illustrates a cross-sectional view of the FIG. 10 device at a stage of processing subsequent to that shown in FIG. 12.
Figure 14:
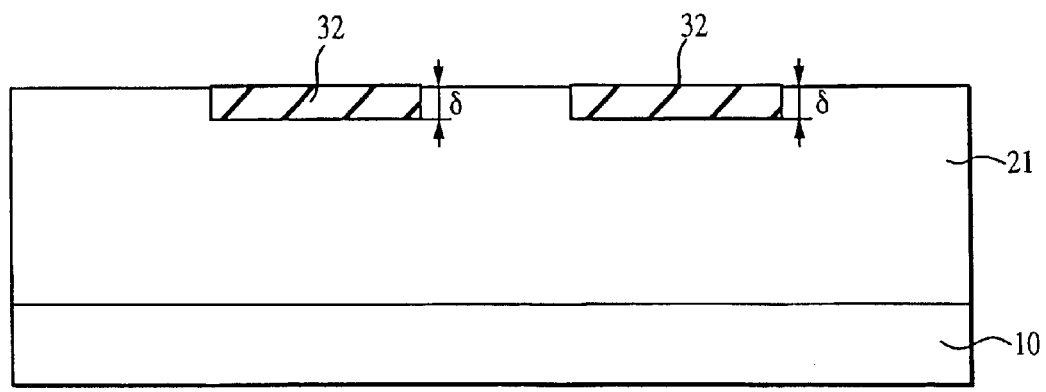
FIG. 14 illustrates a cross-sectional view of the FIG. 7 device taken along line 14–14' and at a stage of processing subsequent to that shown in FIG. 12.
Figure 15:
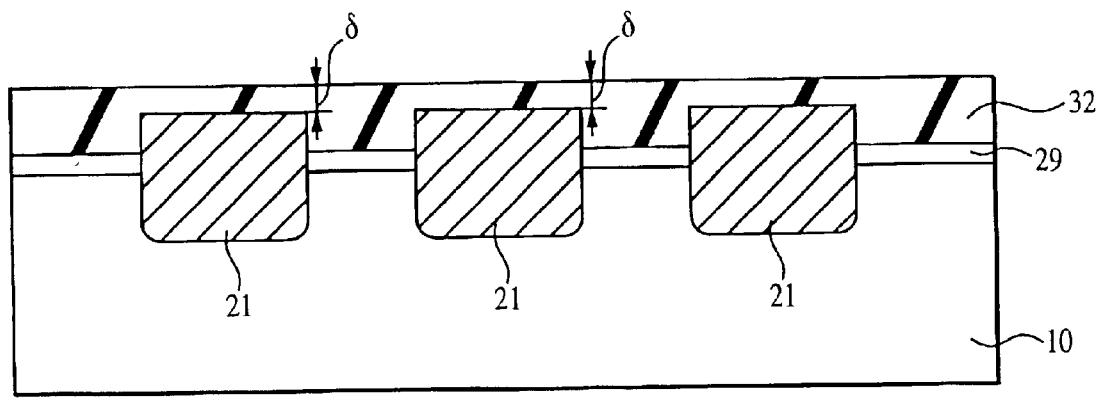
FIG. 15 illustrates a cross-sectional view of the FIG. 7 device taken along line 15–15' and at a stage of processing subsequent to that shown in FIG. 12.

A polysilicon layer 30 (FIG. 12) is then formed over both regions A, B as well as inside the transistor grooves 22 and the recessed structures 24 of the substrate 10. The polysilicon layer 30 may be deposited over the thin gate oxide layer 29 via LPCVD procedures, at a temperature of about 300° C. to about 700° C. After its deposition, polysilicon layer 30 is planarized down to or near the planar surface of the silicon nitride layer 14 of the regions A, to form polysilicon gate layers 32, as shown in FIG. 13. Chemical mechanical polishing (CMP) may be used for planarizing, but other suitable methods could be used also, as desired. For a better understanding on how the CMP of the polysilicon stops on the nitride layer 14, reference is made to FIGS. 14–15, which are cross sectional views of the structure of FIG. 7, taken along lines 14–14' and 15–15' respectively, but after the deposition and polishing of the conductive layer 30.

Figure 16:
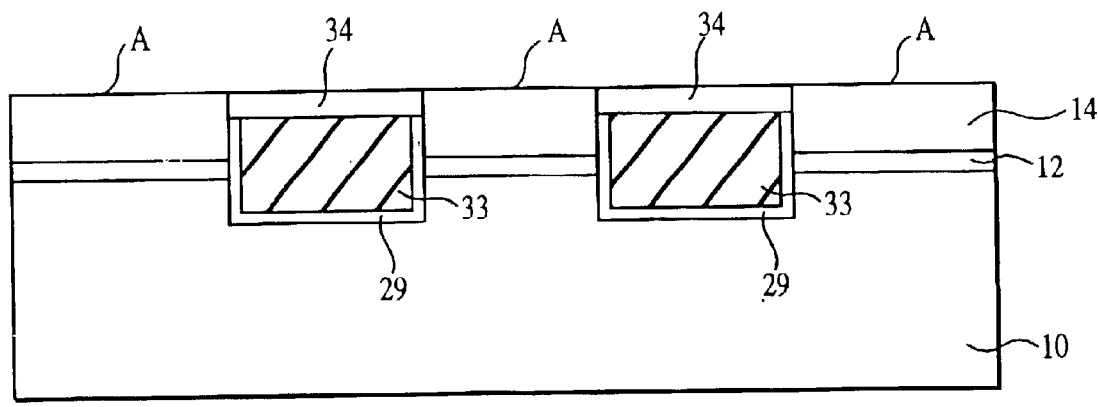
FIG. 16 illustrates a cross-sectional view of the FIG. 10 device at a stage of processing subsequent to that shown in FIG. 13.
Figure 17:
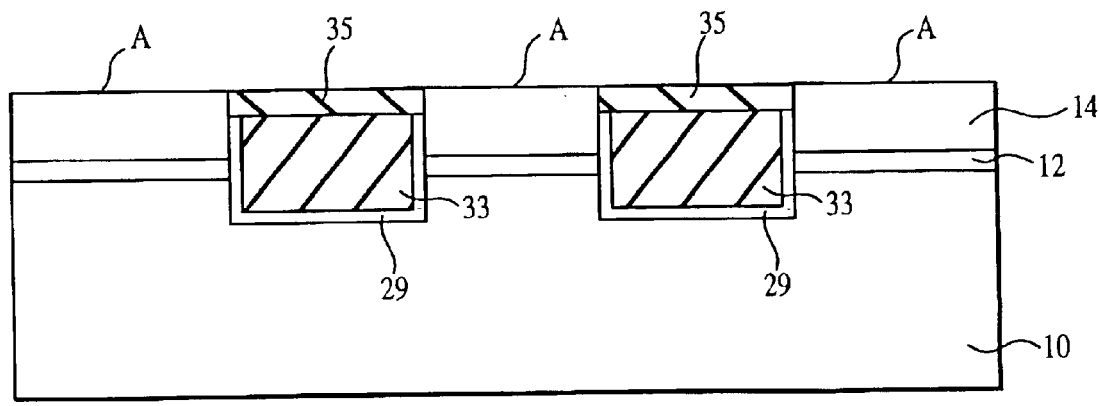
FIG. 17 illustrates a cross-sectional view of the FIG. 10 device at a stage of processing subsequent to that shown in FIG. 16 and in accordance with a first embodiment of the invention.

Reference is now made to FIG. 16, which illustrates the structure of FIG. 13 but with the polysilicon gate layers 32 and portions of the thin gate oxide layer 29 etched about 100 Angstroms to about 500 Angstroms. The polysilicon gate layers 32 and portions of the thin gate oxide layer 29 and etched selective to the silicon nitride 14 of the regions A to obtain recessed regions 34 and polyisilicon gates 33, shown in FIG. 16.

In an exemplary embodiment of the invention, a dielectric layer 35 (FIG. 17) is next formed over the polyisilicon gates 33 to completely fill the recessed regions 34 of FIG. 16. The dielectric layer 35 may include an oxide material, for example, and may be formed by conventional deposition methods followed by polishing by CMP, for example.

Figure 18:
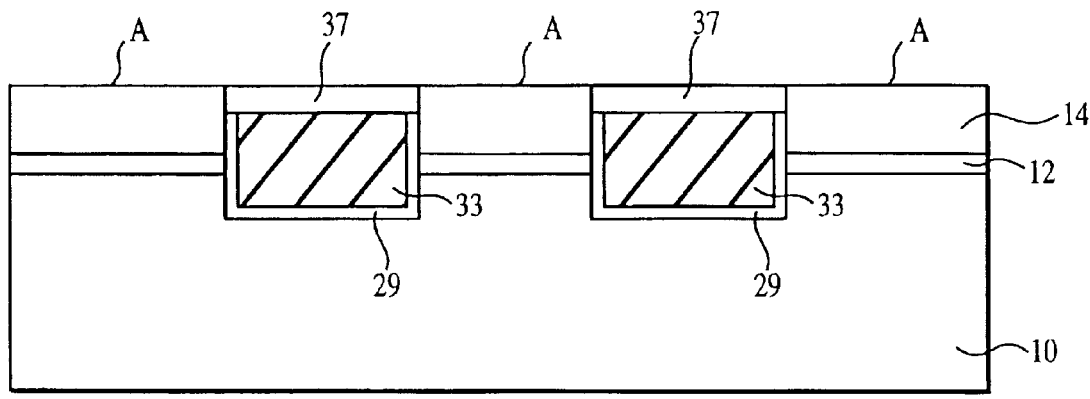
FIG. 18 illustrates a cross-sectional view of the FIG. 10 device at a stage of processing subsequent to that shown in FIG. 16 and in accordance with a second embodiment of the invention.
Figure 19:
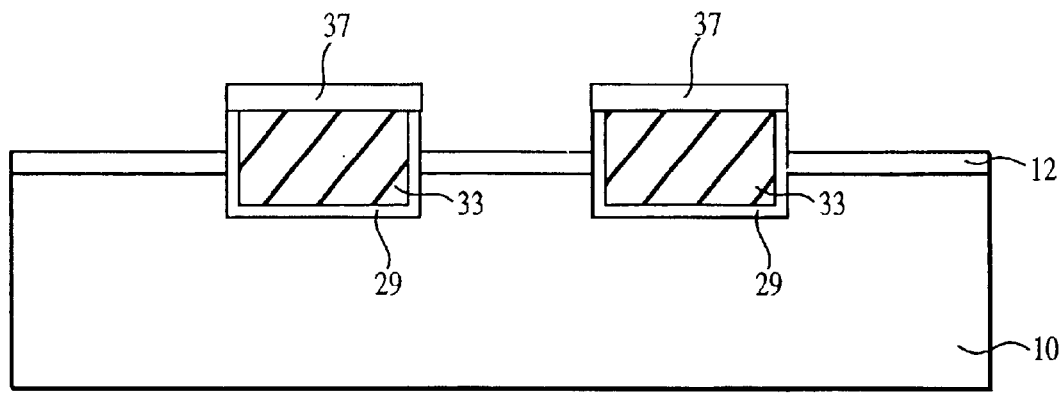
FIG. 19 illustrates a cross-sectional view of the FIG. 18 device at a stage of processing subsequent to that shown in FIG. 18.
Figure 20:
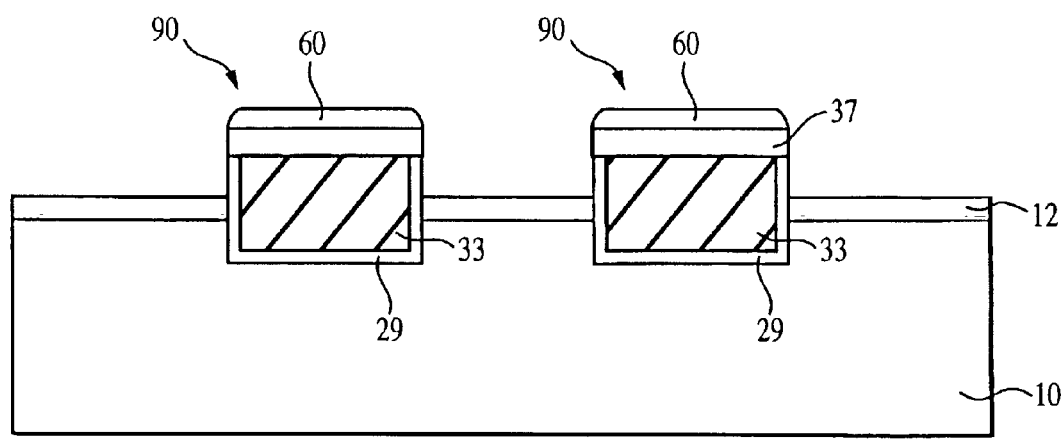
FIG. 20 illustrates a cross-sectional view of the FIG. 18 device at a stage of processing subsequent to that shown in FIG. 19.

Alternatively, a layer of metal capable of forming a silicide (not shown) may be deposited over the polysilicon gates 33 to a thickness of about 200 Angstroms to about 500 Angstroms. For deposition, sputtering by RF or DC may be employed but other similar methods such as CVD may be used. Subsequent to the deposition of the metal capable of forming a silicide, substrate 10 undergoes a rapid thermal anneal (RTA), typically for about 10 to 60 seconds, using a nitrogen ambient, at about 600° C. to about 850° C. so that the metal in direct contact with the polysilicon gates 33 is converted to its silicide. As shown in FIG. 18, silicide regions 37 form conductive regions on top of the polysilicon gates 33. Preferably, the refractory metal has low resistance and low resistivity as a silicide. However, the refractory metal silicide may comprise any refractory metal, including but not limiting to titanium, cobalt, tungsten, tantalum, molybdenum, and platinum.

After the removal with a selective etchant of any unreacted metal, the nitride portions of regions A are removed (FIG. 19) by etching, for example, so that the formation of gate stacks 90 (FIG. 20) of DRAM memory device 100 be completed. Although the following processing steps for the completion of the gate stacks 90 will refer to and illustrate the silicide regions 37 formed over the polysilicon gates 33, it must be understood that the present invention is not limited to this embodiment, and other embodiments such as the formation of gate stacks comprising a dielectric material, such as the dielectric material 35 (FIG. 17), formed over the polysilicon gate, are also contemplated. In any event, a cap material is deposited over substrate 10 and the substrate top surface is planarized so that cap regions 60 (FIG. 20) are formed over the silicide regions 37. The cap material may be formed of silicon dielectrics such as silicon nitride or silicon oxide, but TEOS or carbides may be used also.

At this point recessed gate stacks 90 (FIG. 20) each having gate oxide layer 29, polysilicon gate 33, silicide region 37 and nitride cap 60 have been formed. The recessed gate stacks 90 may now be used in a conventional implant process where the gate structures are needed to mask the dopant implantation of source regions 92 (FIG. 21) and drain regions 94 (FIG. 21) of the adjacent transistors defined by the gate stacks.

Figure 21:
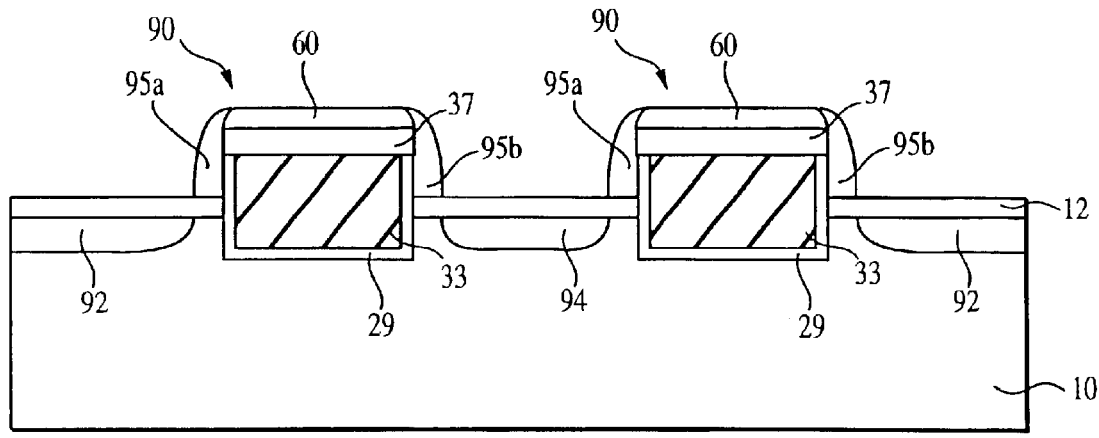
FIG. 21 illustrates a cross-sectional view of the FIG. 18 device at a stage of processing subsequent to that shown in FIG. 20.
Figure 22:
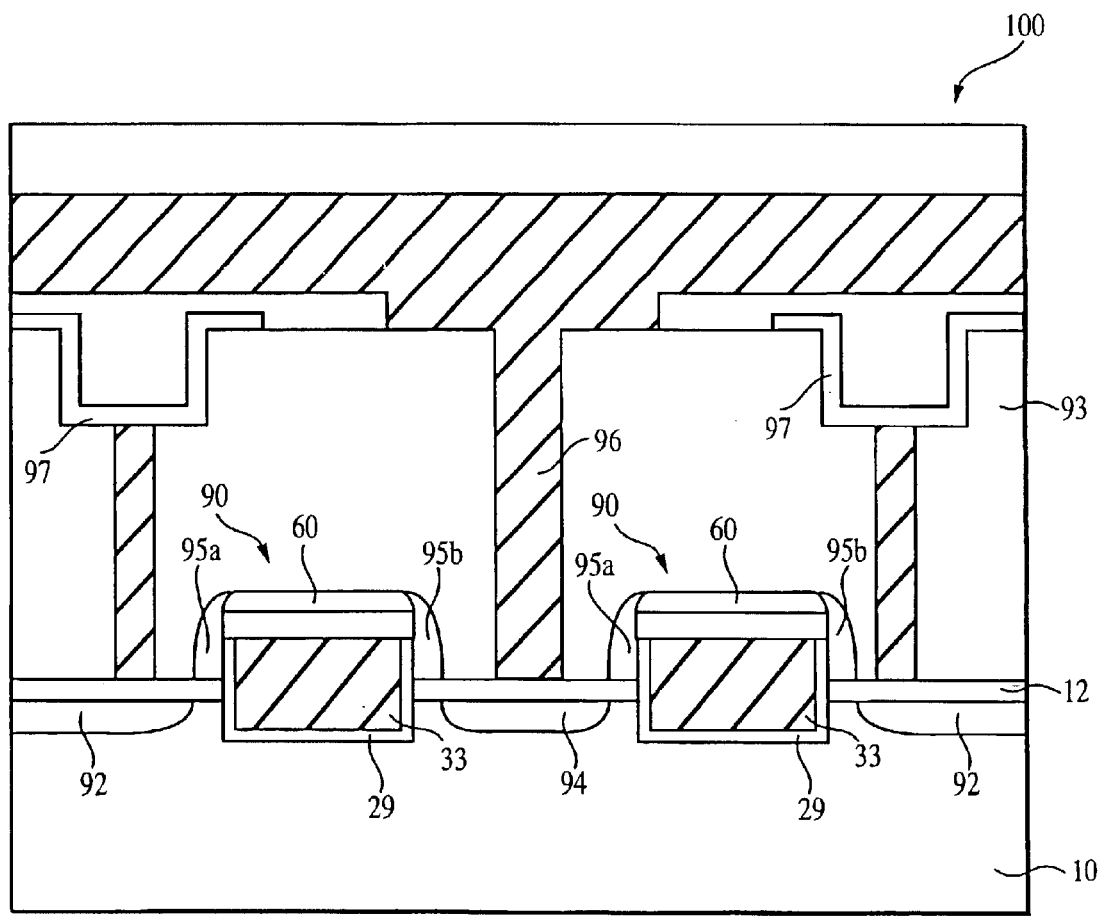
FIG. 22 illustrates a cross-sectional view of the FIG. 18 device at a stage of processing subsequent to that shown in FIG. 21.

The next step in the flow process is the formation of nitride spacers 95a, 95b also illustrated in FIG. 21. The recessed gate stacks 90 protected by nitride spacers 95a, 95b can now undergo conventional processing steps for the formation of contact openings for conductors and/or capacitors into semiconductor substrate 10 through an oxide layer 93 such as BPSG, for example. Thus, conventional processing steps can be carried out to form a conductor 96 and capacitors 97 as well as other interconnect structures necessary to produce a semiconductor device such as the DRAM memory device 100, all illustrated in FIG. 22.

Figure 23:
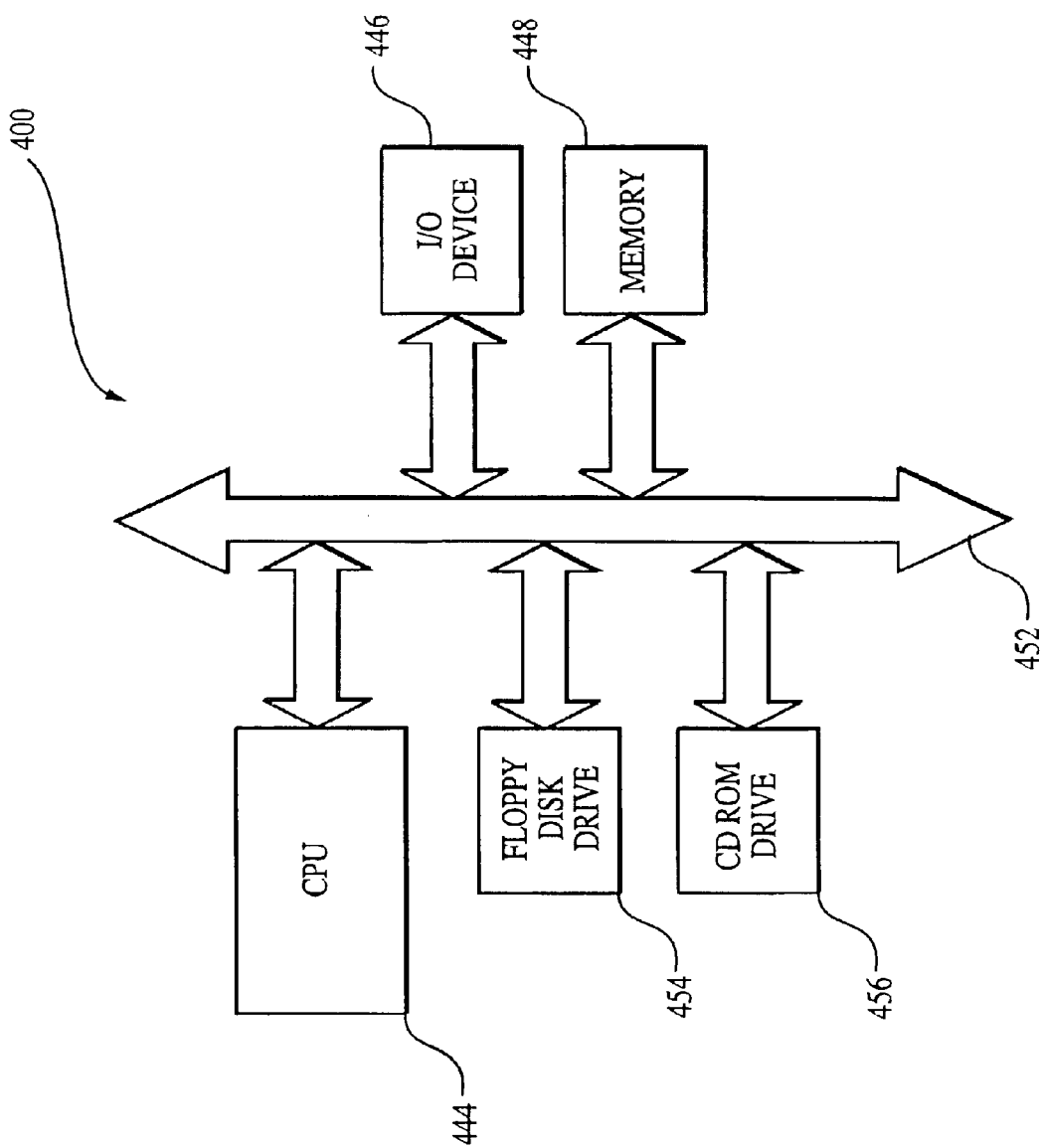
FIG. 23 is an illustration of a computer system having a DRAM access transistor be formed according to a method of the present invention.

The recessed gate stacks 90 (FIGS. 20–22) formed in accordance with embodiments of the present invention could be used in any integrated circuit structure such as in a processor-based system 400 which includes a memory circuit 448, for example the DRAM memory device 100, as illustrated in FIG. 23. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A method of forming a structure for a semiconductor device, said method comprising the acts of:

forming isolation regions in an insulating layer over a semiconductor substrate, said isolation regions comprising an insulating material, said isolation regions extending in a first direction;

forming a set of trenches in said semiconductor substrate and extending through said insulating layer, said set of trenches being formed in a second direction orthogonal to said first direction; and recessing regions of said isolation regions to form recessed isolation regions adjacent to said set of trenches.

2. The method of claim 1 further comprising the acts of:

forming a gate oxide within said set of trenches;

forming a conductive layer over said gate oxide and said recessed isolation regions; and polishing said conductive layer relative to said recessed isolation regions to form a conductive gate.

3. The method of claim 2 further comprising etching said conductive gate to form a recessed conductive gate.

4. The method of claim 3, wherein said conductive gate is etched about 100 Angstroms to about 300 Angstroms.

5. The method of claim 3, wherein said recessed conductive gate is formed to a width of about 1000 Angstroms to about 2000 Angstroms.

6. The method of claim 3 further comprising forming a silicide layer over said recessed conductive gate.

7. A method of forming a gate structure for a semiconductor device, said method comprising the acts of:

forming shallow trenches for isolation regions in an insulating layer over a semiconductor substrate, said shallow trenches for isolation regions comprising an insulating material and extending in a first direction;

forming a plurality of trenches in said semiconductor substrate and extending through said insulating layer, said plurality of trenches being formed in a second direction orthogonal to said first direction;

recessing regions of said shallow trenches for isolation regions to form recessed shallow trenches for isolation regions adjacent to said plurality of trenches;

forming a gate oxide within said plurality of trenches;

forming a conductive layer over said gate oxide and said recessed shallow trenches for isolation regions;

polishing said conductive layer relative to said recessed shallow trenches for isolation regions to form a conductive gate; and etching said conductive gate to form a recessed conductive gate.

8. The method of claim 7, wherein said recessed conductive gate is formed to a width of about 1000 Angstroms to about 2000 Angstroms.

9. A recessed gate structure having a width of about 1000 Angstroms to about 2000 Angstroms, said recessed gate structure comprising an oxide layer having a thickness of about 30 Angstroms to about 100 Angstroms, a polysilicon layer overlying said oxide layer, a dielectric layer overlying said oxide layer and spacers on at least a sidewall portion of said recessed gate structure, said spacers being in contact with at least a vertical portion of said oxide layer.

10. A DRAM cell, comprising:
at least a recessed gate structure formed over a substrate, said recessed gate structure comprising an oxide layer, a polysilicon layer overlying said oxide layer, and a dielectric layer overlying said oxide layer, said recessed gate structure having at least a portion located wholly above a surface of said substrate, and wherein said portion located wholly above said surface of said substrate has spacers on sidewalls of said portion, wherein said spacers comprise a nitride material; and
a container capacitor located wholly above said surface of said substrate.

11. The DRAM cell of claim 10, wherein said gate structure has a width of about 1000 Angstroms to about 2000 Angstroms.

12. The DRAM cell of claim 10, wherein said oxide layer has a thickness of about 30 Angstroms to about 100 Angstroms.

13. The DRAM cell of claim 10, wherein said gate structure further comprises a silicide layer formed over said polysilicon layer.

14. The DRAM cell of claim 10 further comprising a bit line extending above said recessed gate structure, said bit line being located wholly above said surface of said substrate.

15. A DRAM cell, comprising:
at least a recessed gate structure formed over a substrate, said recessed gate structure comprising an oxide layer, a polysilicon layer overlying said oxide layer, and a dielectric layer overlying said oxide layer, said recessed gate structure having at least a portion located wholly above a surface of said substrate, and wherein said portion located wholly above said surface of said substrate has spacers on sidewalls of said portion;
source and drain regions located on each side of said recessed gate structure, said source and drain regions being spaced apart from said portion located wholly above said surface of said substrate by at least a thickness of said spacers; and
a container capacitor located wholly above said surface of said substrate.

16. A DRAM cell, comprising:
at least a recessed gate structure formed over a substrate, said recessed gate structure having a width of about 1000 Angstroms to about 2000 Angstroms, said recessed gate structure comprising an oxide layer, a polysilicon layer overlying said oxide layer, and a dielectric layer overlying said oxide layer, said recessed gate structure having at least a portion located wholly above a surface of said substrate and at least a portion located below said surface of said substrate, and wherein said portion located wholly above said surface of said substrate has spacers on its sidewalls;
source and drain regions located on each side of said recessed gate structure and below said surface of said substrate, said source and drain regions being spaced apart from said recessed gate structure by at least a thickness of said spacers;
a container capacitor located wholly over said surface of said substrate; and
at least one bit line in connection to said recessed gate structure, said bit line being located wholly above said surface of said substrate.

* * * * *